US009612576B2

(12) United States Patent
Dubois et al.

(10) Patent No.: US 9,612,576 B2
(45) Date of Patent: Apr. 4, 2017

(54) TIMEPIECE ESCAPEMENT MECHANISM WITHOUT LUBRICATION

(71) Applicant: Nivarox-FAR S.A., Le Locle (CH)

(72) Inventors: Philippe Dubois, Marin (CH); Christian Charbon, Chezard-St-Martin (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 14/693,086

(22) Filed: Apr. 22, 2015

(65) Prior Publication Data

US 2015/0323901 A1   Nov. 12, 2015

(30) Foreign Application Priority Data

May 8, 2014   (EP) ..................................... 14167573

(51) Int. Cl.
| | |
|---|---|
| *G04B 15/14* | (2006.01) |
| *G04B 15/00* | (2006.01) |
| *C23C 14/34* | (2006.01) |
| *C23C 16/50* | (2006.01) |

(Continued)

(52) U.S. Cl.
CPC .............. *G04B 15/00* (2013.01); *C23C 14/34* (2013.01); *C23C 16/345* (2013.01); *C23C 16/50* (2013.01); *G04B 15/14* (2013.01); *G04D 3/0087* (2013.01)

(58) Field of Classification Search
CPC ........ G04B 15/14; G04D 3/00; G04D 3/0028; G04D 3/0087
See application file for complete search history.

(56) References Cited

U.S. PATENT DOCUMENTS

| | | | | |
|---|---|---|---|---|
| 3,738,101 A | * | 6/1973 | Simon-Vermot | ...... G04B 15/14 368/125 |
| 8,422,339 B2 | * | 4/2013 | Martin | ................. C10M 177/00 368/62 |

(Continued)

FOREIGN PATENT DOCUMENTS

EP          0 732 635 A1     9/1996

OTHER PUBLICATIONS

Electronic English Translation of Haenni, EP0732635, translated Sep. 28, 2015.*

(Continued)

*Primary Examiner* — Amy Cohen Johnson
*Assistant Examiner* — Jason Collins
(74) *Attorney, Agent, or Firm* — Oblon, McClelland, Maier & Neustadt, L.L.P.

(57) ABSTRACT

A timepiece escapement mechanism with improved tribology includes at least one pair of components including a first component and a second component respectively including a first friction surface and a second friction surface which are arranged to cooperate in contact with each other. The second friction surface includes at least one silicon-based material taken from a group including silicon, silicon dioxide, amorphous silicon, polycrystalline silicon, porous silicon, or a mixture of silicon and silicon oxide. The first friction surface is formed by a surface of a solid element which is made of solid silicon nitride in a stoichiometric formulation $Si_3N_4$. A method for making the escapement mechanism is also provided.

19 Claims, 2 Drawing Sheets

(51) Int. Cl.
*C23C 16/34* (2006.01)
*G04D 3/00* (2006.01)

(56) References Cited

U.S. PATENT DOCUMENTS

| | | | |
|---|---|---|---|
| 2002/0114225 A1* | 8/2002 | Damasko | G04B 15/14 368/125 |
| 2004/0007092 A1* | 1/2004 | Yoshimura | B82Y 30/00 75/238 |
| 2004/0046909 A1* | 3/2004 | Sekiguchi | G02F 1/13452 349/113 |
| 2005/0092274 A1* | 5/2005 | Battlogg | F01L 1/047 123/90.17 |
| 2007/0289856 A1* | 12/2007 | Horton | H01H 19/11 200/327 |
| 2008/0023524 A1* | 1/2008 | Ohashi | B23K 20/1245 228/2.1 |
| 2008/0219104 A1* | 9/2008 | Jurin | G04B 15/06 368/132 |
| 2010/0013353 A1* | 1/2010 | Wischnewskij | H01L 41/083 310/317 |
| 2010/0266226 A1* | 10/2010 | Vollmann-Schipper | F16C 33/201 384/129 |
| 2011/0225801 A1* | 9/2011 | Fussinger | G04B 13/026 29/525.01 |
| 2012/0051192 A1* | 3/2012 | Steinmuller | C23C 16/26 368/127 |
| 2012/0090933 A1* | 4/2012 | Conus | G04B 13/022 188/371 |
| 2012/0263909 A1* | 10/2012 | Gluche | B81B 3/0075 428/76 |
| 2013/0148480 A1* | 6/2013 | Charbon | G04B 15/00 368/132 |
| 2013/0234165 A1* | 9/2013 | Bourban | B81B 3/0075 257/77 |
| 2014/0160901 A1* | 6/2014 | Cusin | G04B 13/022 368/127 |

OTHER PUBLICATIONS

European Search Report issued Feb. 3, 2015 in European Application 14167573.6, filed on May 8, 2014 (with English translation).
Keren Deng, et al., "A study of static friction between silicon and silicon compounds", Electronics Design Center and Department of Electrical Engineering & Applied Physics, XP-002734688, 1991, pp. 14-20.
A Stoffel, et al., "LPCVD against PECVD for micromechanical applications", XP-002734924, 1995, pp. 1-13.

* cited by examiner

TIMEPIECE ESCAPEMENT MECHANISM WITHOUT LUBRICATION

This application claims priority from European patent application No. 14167573.6 filed May 8, 2014, the entire disclosure of which is hereby incorporated by reference.

FIELD OF THE INVENTION

The invention concerns a timepiece escapement mechanism with improved tribology, including at least one pair of components including a first component and a second component respectively including a first friction surface and a second friction surface which are arranged to cooperate in contact with each other, The invention also concerns a method for making such an escapement mechanism.

The invention concerns the field of timepiece mechanisms including components that are permanently in motion, and more specifically the field of escapement mechanisms.

BACKGROUND OF THE INVENTION

Timepiece designers have always endeavoured to increase the reliability of movements, as a result of reducing the frequency of maintenance operations, while ensuring accurate operation of the timepiece movements.

The lubrication of wheels and pinions and moving components is a difficult problem to resolve. Lengthy tribological testing is required to develop solutions to simplify or even eliminate lubrication.

More specifically, it is sought to achieve lubrication-free operation of escapement mechanisms, by attempting to define pairs of materials in friction contact having a low and stable coefficient of friction and low wear, and exhibiting excellent resistance over time.

EP Patent Application No 0732635A1 in the name of CSEM discloses the manufacture of a micromechanical component, particularly a pallet lever of an escapement, with a friction surface including silicon nitride, in an unspecified composition. This document envisages a pair with a counter-piece, with improved tribology: this document cites a titanium nitride against titanium carbide pair, or a titanium nitride against silicon carbide pair.

The document XP XP002734688, "A study of static friction between silicon and silicon compounds", by Messrs Deng and Ko, describes the use in precision micromechanics of the silicon nitride-silicon pair, for low wear over time, and improved tribology.

The document XP002734924, "LPCVD against PECVD for micromechanical applications" by Messrs Stoffel, Kovacs, Kronsat, Müller discloses the use of non-stoichiometric silicon nitride, obtained by PECVD or LPCVD, to ensure tribological properties.

SUMMARY OF THE INVENTION

The invention proposes to provide a solution to this problem.

The invention more particularly concerns the utilisation of silicon nitride as a high performance tribological material in the escapement.

To this end, the invention concerns a timepiece escapement mechanism with improved tribology, including at least one pair of components including a first component and a second component respectively including a first friction surface and a second friction surface which are arranged to cooperate in contact with each other, characterized in that said second friction surface includes at least one silicon-based material taken from a group including silicon (Si), silicon dioxide ($SiO_2$), amorphous silicon (a-Si), polycrystalline silicon (p-Si), porous silicon, or a mixture of silicon and silicon oxide, and characterized in that said first friction surface is formed by the surface of a solid element which is made of solid silicon nitride in the stoichiometric formulation $Si_3N_4$.

The invention also concerns a method for making such an escapement mechanism, characterized in that a layer of silicon nitride is applied to a substrate to form one of said first or second friction surfaces, either by a plasma enhanced chemical vapour deposition (PECVD), or by a chemical vapour deposition (CVD), or by cathodic sputtering.

The invention also concerns a method for making such an escapement mechanism, characterized in that a silicon nitride component is made with a substrate to form one of said first or second friction surfaces, either by sintering or by solid processing.

According to a feature of the invention, each pair formed by a first friction surface and an opposing second surface is made with the $Si_3N_4$/Si pair.

BRIEF DESCRIPTION OF THE DRAWINGS

Other features and advantages of the invention will appear upon reading the following detailed description, with reference to the annexed drawings, in which.

DETAILED DESCRIPTION OF PREFERRED EMBODIMENTS

The invention concerns the utilisation of silicon nitride as the material permitting the timepiece escapement to operate without lubrication.

For convenience of language, "silicon nitride" will be used hereafter in the broad sense of a material which is formed:

either of stoichiometric silicon ($Si_3N_4$), which may be solid in the most general case, or in a thin layer;

or in a non-stoichiometric composition $Si_xN_yH_z$, where x is equal to 1, y is comprised between 0.8 and 5.0 and z is comprised between 0.00 and 0.70, and more specifically between 0.04 and 0.70, which is preferably applied in a thin layer, but which may also be formed of a solid component.

"Solid" means here a component whose smallest dimension is greater than 0.10 mm, whereas the smallest dimension of a "thin layer" is less than 10 micrometers, and preferably less than 1 micrometer.

In fact, tests have established that the friction of silicon nitride against silicon or silicon oxide exhibits particularly desirable properties in a timepiece mechanism, and more specifically in the case of an escapement mechanism.

This friction pair has a low coefficient of friction, less than 0.17, over a broad force-speed range (1 mN-100 mN and 1 cm/s-10 cm/s).

Figure 1:
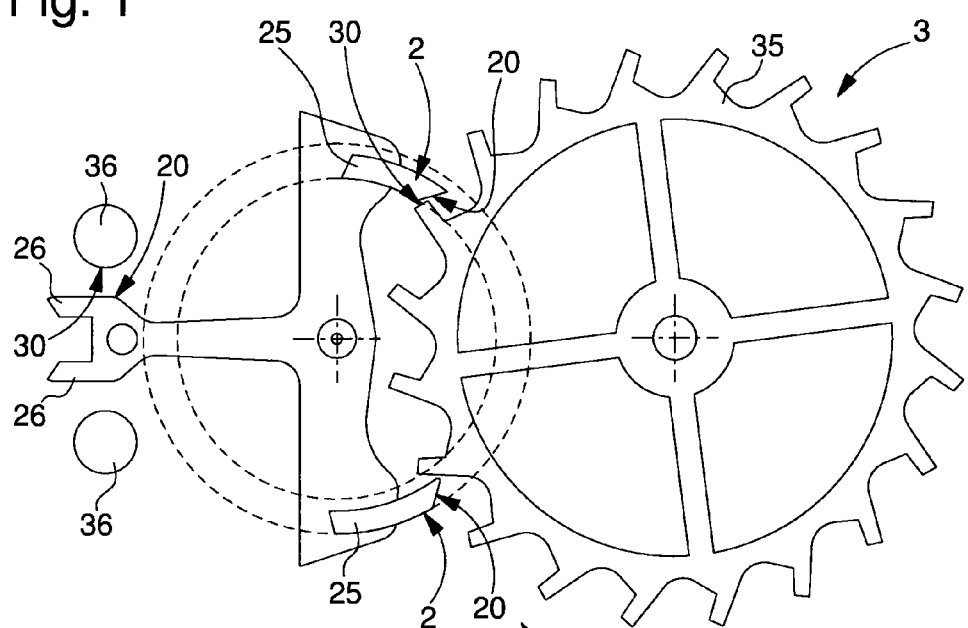
FIG. 1 shows a schematic, plan view of an escapement mechanism including, in particular, a pallet-stone cooperating in contact with an escape wheel, on contact surfaces arranged according to the invention.
Figure 2:
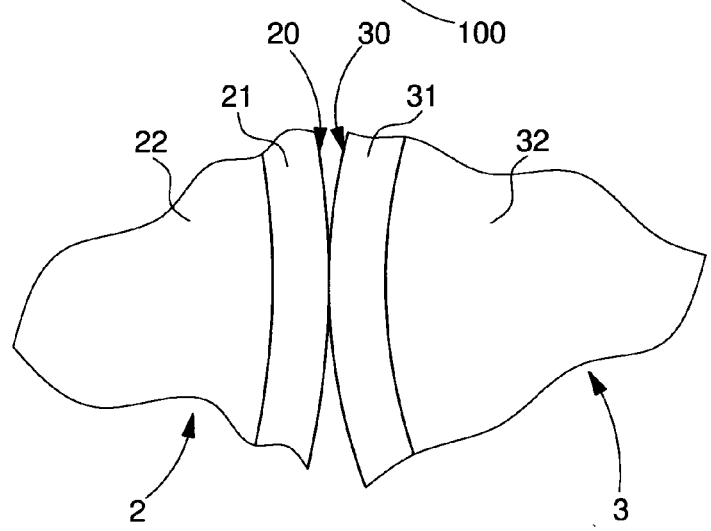
FIG. 2 shows a schematic view of the cooperation between the opposing contact surfaces.
Figure 3:
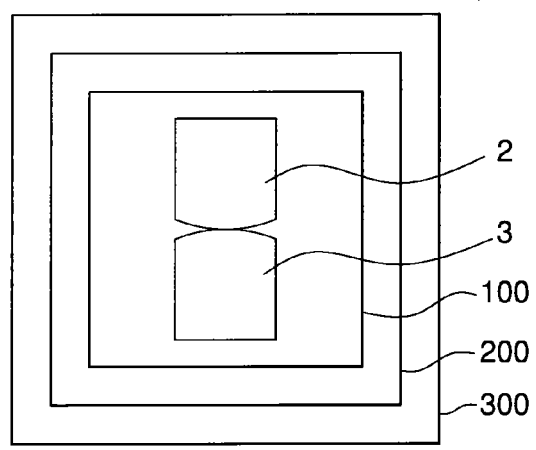
FIG. 3 shows block diagrams of a timepiece including a movement including an escapement mechanism which comprises a pair of components arranged according to the invention.
Figure 4:
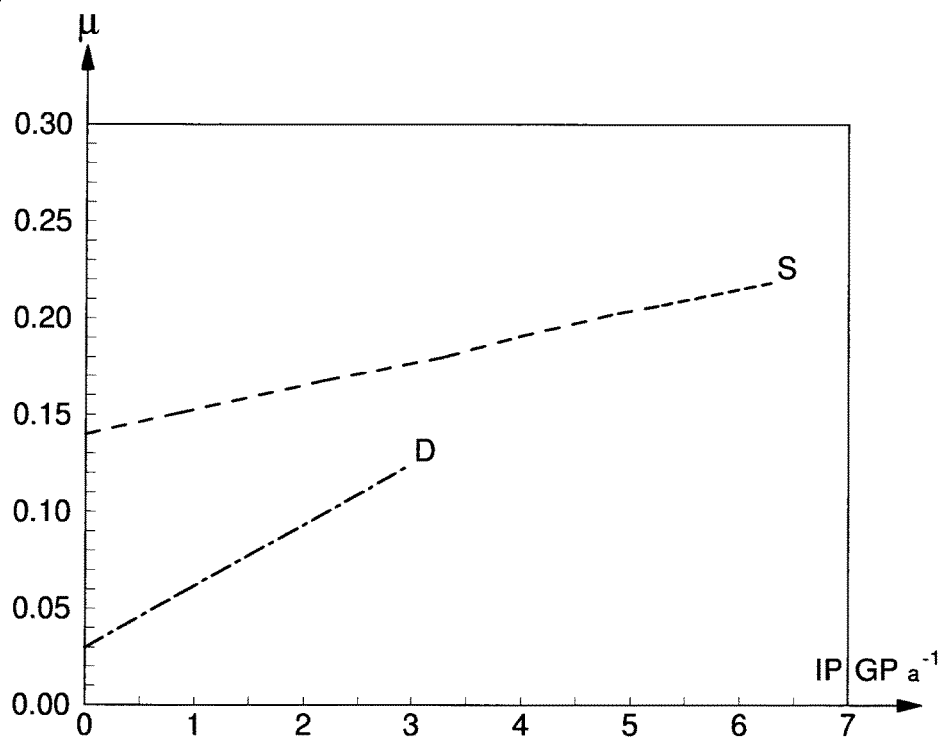
FIG. 4 is a diagram showing a coefficient of friction on the y-axis as a function of the inverse of a contact pressure on the x-axis, in $GPa^{-1}$, for the sapphire/diamond-like-carbon (or DLC) pair on the upper dotted curve, and for the diamond/diamond-like-carbon (or DLC) pair on the lower broken line curve.

The work of the authors cited below demonstrates that, for hard elastic materials, due to the increase in shearing stress as a function of pressure, the coefficient of friction usually varies according to the rule illustrated by FIG. 4, of type: $\mu = S/P + \alpha$, where: S: shearing stress limit, P: Hertz pressure, $\alpha$: parameter.

Parameter S determines the dependence of the pair as a function of pressure, and is consequently particularly useful to consider in the case of dry friction in the escapement where the contact pressures and forces vary greatly.

Figure 5:
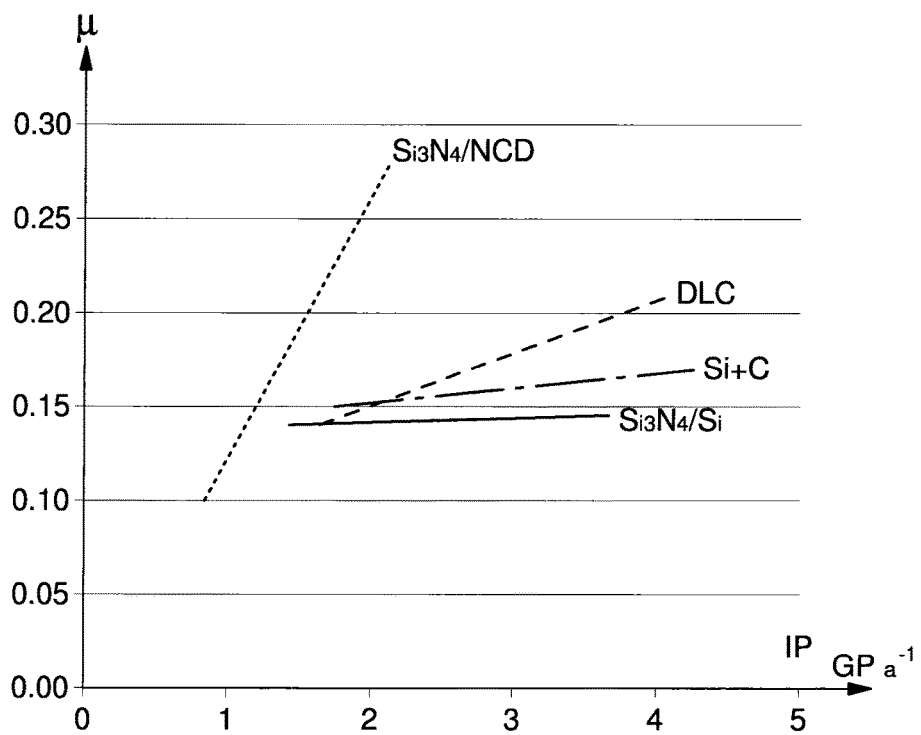
FIG. 5 is a similar diagram to that of FIG. 4, for the $Si_3N_4$/nanocrystalline diamond (or NCD) pair in the upper dotted line, for the diamond-like-carbon (or DLC)/ruby pair on the dash line curve, and for the carbon-implanted silicon/ruby pair in the intermediate broken line curve, and for the $Si_3N_4$/Si pair preferred by the invention on the lower, almost horizontal solid line curve.

In comparison to other friction pairs, the silicon nitride/Si or silicon nitride/$SiO_2$ pairs exhibit low dependence of the coefficient of friction as a function of the normal applied force, as seen in FIG. 5. This results in a very low parameter S. This behaviour is particularly useful in the escapement since the normal force varies greatly, typically by 0 to 100 nM during contacts and impacts. During loss of contact and contact, silicon nitride maintains a low coefficient of friction of less than 0.2, a value which is usually considered as the critical operating threshold of the escapement.

The invention thus concerns a timepiece mechanism, and more particularly a timepiece escapement mechanism 100, with improved tribology based on these findings.

Thus, according to the invention, this escapement mechanism 100 includes at least one pair of components, including a first component 2 and a second component 3, which respectively include a first friction surface 20 and a second friction surface 30, which are arranged to cooperate in contact with each other.

The first friction surface 20, 30 includes silicon nitride which is either stoichiometric silicon nitride ($Si_3N_4$), or non-stoichiometric silicon nitride ($Si_xN_yH_z$), where x is equal to 1, y is comprised between 0.8 and 5.0, and z is comprised between 0.00 and 0.70.

The second friction surface 30, 20 includes at least one silicon-based material taken from a group including silicon (Si), silicon dioxide ($SiO_2$), amorphous silicon (a-Si), polycrystalline silicon (p-Si), porous silicon, or a mixture of silicon and silicon oxide.

"Amorphous silicon (a-Si) means here silicon deposited by PECVD in a thin layer, of 50 nm to 10 micrometers, of amorphous structure; it may also be hydrogenated or n-type or p-type doped.

"Polycrystalline silicon (p-Si)" means here silicon deposited by LPCVD formed of grains of microcrystalline silicon, the grain size being from 10 to 1000 nm; it may also be n-type or p-type doped. E is close to 160 GPa.

"Porous silicon" means here a material with a pore size of 2 nm to 10 micrometers, made according to a complex manufacturing process based on anodising (electrolyte HF and an electric current).

More particularly, at least one of these first or second friction surfaces 20, 30 is formed, either by the surface of a solid element made of solid silicon nitride, preferably but in a non-limiting manner in the stoichiometric formulation $Si_3N_4$, or by the surface of a thin layer, preferably, but non-limited to a non-stoichiometric composition $Si_xN_yH_z$, where x is equal to 1, y is comprised between 0.8 and 5.0, and z is comprised between 0.00 and 0.70.

More specifically, z is comprised between 0.04 and 0.70.

In the same manner as the first friction surface including silicon nitride, the second friction surface may be either the surface of a solid component, or the surface of a thin layer.

A particularly advantageous application of the invention is the cooperation of the pallet stones made of $Si_3N_4$, in contact with wheels made of $Si+SiO_2$.

Another advantageous application concerns the "solid silicon nitride" application with wheels made of $Si_3N_4$, for example laser cut, or similar, which are in friction contact with a one-piece pallet lever made of $Si+SiO_2$, or with a conventional pallet lever provided with pallet stones made of $Si+SiO_2$.

The combinations that can be used in horology are notably:
wheel made of any form of SiO2, solid quartz $SiO_2$, $Si+SiO_2$, cooperating with pallet-stones made of any form of silicon nitride, in thin layers, or solid silicon nitride;
wheels made of any form of nitride, Si+silicon nitride, solid silicon nitride, cooperating with pallet-stones made of any form of $SiO_2$, particularly solid $Si+SiO_2$, $SiO_2$,
the pallet-stones may be made in one-piece with the pallet lever.

An advantageous application concerns a wheel made of oxidised Si, and pallet-stones made of solid $Si_3N_4$, or pallet-stones made of oxidised Si coated with silicon nitride.

In a specific variant, the first friction surface 20 and the second friction surface 30 each include silicon nitride.

In an advantageous implementation of the invention, the friction surface of friction surfaces 20, 30 which includes silicon nitride, includes silicon nitride ($Si_3N_4$), or is formed of silicon nitride ($Si_3N_4$).

Preferably, the friction surface 20, 30, which includes silicon nitride is a surface of a silicon nitride layer of a thickness of less than 2 micrometers.

Preferably, the thickness of such a silicon nitride layer is comprised between 50 and 1000 nm. More specifically, the thickness of this thin layer of silicon nitride is comprised between 50 nanometers and 500 nanometers.

In a specific variant of the invention, the friction surface 20, 30 which includes silicon nitride is the surface of a silicon nitride layer, which covers a substrate formed of quartz or of silicon or of silicon oxide, or of a mixture of silicon and silicon oxide.

In a particular variant, the friction surface 30, 20 opposing the surface 20, 30 which includes silicon nitride, includes at least one silicon-based material taken from a group including silicon (Si), silicon dioxide (SiO2), amorphous silicon (a-Si), polycrystalline silicon (p-Si), porous silicon, is a surface of a layer formed exclusively of one or more silicon-based materials taken from said group.

As seen in FIG. 5, the $Si_3N_4$/Si pair gives particularly advantageous results, in that the friction torque is substantially constant, without requiring any lubrication at all.

Indeed, the equations giving the shape of the mean line between the experimental points corresponding to the various pairs of FIG. 5 are:

Y=0.1356X−0.0068 for the $Si_3N_4$/nanocrystalline diamond (or NCD) pair on the upper dotted curve, Y=0.0288X+0.0928 for the diamond-like-carbon (or DLC)/ruby pair on the dash line curve, Y=0.0097X+0.1302 for the carbon-doped silicon/ruby pair on the intermediate broken line curve, Y=0.0024X+0.1362 for the $Si_3N_4$/Si pair preferred by the invention on the lower almost horizontal solid line curve.

The invention also concerns a method for making such an escapement mechanism 100.

According to this method, a layer of silicon nitride is applied to a substrate to form one of these first or second friction surfaces 20, 30, either by plasma enhanced chemical vapour deposition (PECVD) or by chemical vapour deposition (CVD) or by cathodic sputtering.

More specifically, a silicon nitride component is made with a substrate to form one of the first or second friction surfaces 20, 30, either by sintering, or by solid processing, i.e. in the form of a solid component as defined above, whose smallest dimension is greater than 0.10 mm.

In particular, for the deposition of a layer including silicon nitride, or formed of silicon nitride, one or more of the technologies known to those skilled in the art specialised in MEMS may be used. LPCVD (low-pressure chemical vapour deposition), PECVD (plasma enhanced chemical vapour deposition), CVD (chemical vapour deposition), ALD (atomic layer deposition), cathodic sputtering, ionic implantation and similar processes may be used.

Preferably, a Si/N ratio of between 0.2 and 1.2 will be used. More specifically, the Si/N value of 0.4 is stoichiometric (silicon nitride rich in Si, low stress or compressive $Si_xN_yH_z$, according to Gardeniers et al).

Preferably, a hydrogen concentration of between 2 and 30% H will be selected.

Preferably, in a non-limiting manner, an ordinary Si substrate will be selected.

As regards the sub-layer, $SiO_2$ may be selected, in a non-limiting manner, typically in a thickness of between 50 and 2000 nm, or poly-Si, SiC, or similar.

The technological limitations related to silicon nitride deposition are known to those skilled in the art in the field of MEMS.

Thus, the thickness of a silicon nitride layer is preferably comprised between 50 and 1000 nm.

As regards the state of compression of silicon nitride, it is known to those skilled in the art specialising in MEMS that the increase in concentration of Si reduces the tensions in silicon nitride and can even make it compressive. It is known that the materials having compressive stress generally result in a reduction in friction wear. This corresponds to Si rich silicon nitride.

For proper implementation of the invention, it is important for the silicon nitride layer to adhere properly to the substrate, and for the elastic modulus of the materials not to be too remote. The nature of the underlying materials is of less importance. If the silicon nitride layer exceeds a thickness of close to 100 nm, friction is determined by this silicon nitride layer.

Pallet-stones made of one-piece $Si_3N_4$ may be produced by means of the same techniques as those used for the manufacture of polycrystalline ruby, known to those skilled in the art.

Further, although difficult to achieve at the present time, it is advantageously possible to consider solid silicon nitride in friction contact with Si or $SiO_2$, for example for a silicon nitride pallet-stone against a wheel made of $SiO_2$.

The invention has numerous advantages:

low dependence of the coefficient of friction as a function of the speed of friction. Particularly useful in the case of the escapement since the speed typically varies between 0 and 3 cm/s.

a stable coefficient of friction as a function of speed and pressure reduces the risk of the appearance of stick-slip which generally results in accelerated degradation of the materials in friction contact.

no risk of forming a third body adverse to friction.

low chemical reactivity of silicon nitride, particularly in its stoichiometric form $Si_3N_4$, making it impervious to cleaning, degradation, interaction with the ambient medium.

low wear.

Silicon nitride also has the advantage of simple implementation, particularly by PECVD coating, particularly on silicon or silicon oxide. This method of deposition is widely known and used in the silicon industry.

The present invention permits the use of silicon nitride in various forms: deposition by PECVD, CVD, cathodic sputtering, solid, sintered, and others.

This invention includes the friction contact of silicon nitride with non-limiting partners, such as: Si, $SiO_2$, amorphous silicon (a-Si), polycrystalline silicon (p-Si), porous silicon.

Those skilled in the art may refer to the following publications:

[1]: I. L Singer, R. N. Bolster, et al. "Hertzian stress contribution to low friction behavior of thin MoS2 coatings," Applied Physics Letters, Vol. 57, 1990.

[2]: Chromik, R. R., Wahl, K. J.: Friction of microscale contacts on diamond-like carbon nanocomposite coatings. In: Proceedings of the World Tribology Congress III-2005, pp. 829-830. American Society of Mechanical Engineers, New York, N.Y., 2005.

[3]: P. W. Bridgeman, "shearing phenomena at high pressures particularly in inorganic compounds," Proc. Am. Acad. Arts Sci. 71, 387, 1936.

What is claimed is:

1. A timepiece escapement mechanism with improved tribology, comprising:

at least one pair of separate components including a first component and a second component respectively including a first friction surface on the first component and a second friction surface on the second component, the first friction surface and the second friction surface are ranged to cooperate in frictional contact with each other, wherein said second friction surface includes at least one silicon-based material taken from a group including silicon, silicon dioxide, amorphous silicon, polycrystalline silicon, porous silicon, or a mixture of silicon and silicon oxide, and wherein said first friction surface is formed by a surface of a solid element which is made of solid silicon nitride in a stoichiometric formulation $Si_3N_4$.

2. The escapement mechanism according to claim 1, wherein said first friction surface is a surface of a silicon nitride layer of a thickness of less than 1000 nanometers.

3. The escapement mechanism according to claim 2, wherein said first friction surface is a surface of a silicon nitride layer of a thickness of between 50 nanometers and 500 nanometers.

4. The escapement mechanism according to claim 1, wherein said second friction surface which includes at least one silicon-based material taken from a group including silicon, silicon dioxide, amorphous silicon, polycrystalline silicon, porous silicon, is a surface of a layer formed exclusively of one or more silicon-based materials taken from said group.

5. The escapement mechanism according to claim 1, wherein the mechanism includes pallet-stones each forming said first component including said first friction surface and which are arranged to cooperate with an escape wheel forming said second component including said second friction surface.

6. A timepiece movement including at least one escapement mechanism according to claim 1.

7. A timepiece including at least one timepiece movement according to claim 6.

8. A method for making the escapement mechanism according to claim 1, comprising:
applying a layer of silicon nitride to a substrate to form said second friction surface, either by a plasma enhanced chemical vapour deposition, or by a chemical vapour deposition, or by cathodic sputtering.

9. A method for making the escapement mechanism according to claim 1, comprising:
making a silicon nitride component with a substrate form one of said first or second friction surfaces, by sintering.

10. The method for making the escapement mechanism according to claim 9, wherein each pair formed by said first friction surface and said second friction surface that oppose one another, is made with the $Si_3N_4$/Si pair.

11. A method for making the escapement mechanism according to claim 1, comprising:
making a silicon nitride component with a substrate to form one of said first or second friction surfaces, by processing in a form of a solid component whose smallest dimension is greater than 0.10 mm.

12. The escapement mechanism according to claim 1, wherein the solid silicon nitride layer includes a thickness of less than 2 micrometers.

13. The escapement mechanism according to claim 1, wherein a coefficient of friction between the first friction surface and the second friction surface is less than 0.17.

14. The escapement mechanism according to claim 13, wherein the coefficient of friction between the first friction surface and the second friction surface is less than 0.17 over a force range between the first and second friction surfaces of 1 mN to 100 mN.

15. The escapement mechanism according to claim 13, wherein the coefficient of friction between the first friction surface and the second friction surface is less than 0.17 over a relative speed range between the first and second friction surfaces of 1 cm/sec to 10 cm/sec.

16. The escapement mechanism according to claim 1, wherein a coefficient of friction between the first friction surface and the second friction surface varies according to a relation $$\mu = S/P + \alpha,$$

where $\mu$ is the coefficient of friction, S is a shearing stress limit, P is a Hertz pressure, and $\alpha$ is a parameter.

17. The escapement mechanism according to claim 1, wherein said first friction surface is formed by a surface of a solid element which is made of only solid silicon nitride in a stoichiometric formulation $Si_3N_4$.

18. The escapement mechanism according to claim 1, wherein a coefficient of friction between the first friction surface and the second friction surface is less than 0.17 over a force range between the first and second friction surfaces of 1 mN to 100 mN.

19. The escapement mechanism according to claim 1, wherein a coefficient of friction between the first friction surface and the second friction surface is less than 0.17 over a relative speed range between the first and second friction surfaces of 1 cm/sec to 10 cm/sec.

* * * * *